US009500733B2

(12) United States Patent
Kim et al.

(10) Patent No.: US 9,500,733 B2
(45) Date of Patent: Nov. 22, 2016

(54) METHOD AND APPARATUS FOR OBTAINING MAIN MAGNETIC FIELD INFORMATION AND RADIO PULSE RELATED INFORMATION IN A MAGNETIC RESONANCE IMAGING SYSTEM WITH DIFFERENT FLIP ANGLES

(71) Applicants: Samsung Electronics Co., Ltd., Gyeonggi-do (KR); Industry-Academic Cooperation Foundation, Yonsei University, Seoul (KR)

(72) Inventors: Dong-hyun Kim, Seoul (KR); Joon-sung Lee, Seoul (KR); Na-rae Choi, Jeju-do (KR); Min-oh Kim, Seoul (KR)

(73) Assignees: Samsung Electronics Co., Ltd., Yeongtong-gu, Suwon-si, Gyeonggi-do (KR); Industry-Academic Cooperation Foundation, Yonsei University, Yonsei-ro, Seodaemun-gu, Seoul (KR)

( * ) Notice: Subject to any disclaimer, the term of this patent is extended or adjusted under 35 U.S.C. 154(b) by 647 days.

(21) Appl. No.: 13/943,032

(22) Filed: Jul. 16, 2013

(65) Prior Publication Data
US 2014/0232394 A1    Aug. 21, 2014

(30) Foreign Application Priority Data
Feb. 20, 2013   (KR) .................... 10-2013-0018238

(51) Int. Cl.
*G01V 3/00* (2006.01)
*G01R 33/561* (2006.01)
*G01R 33/24* (2006.01)

(52) U.S. Cl.
CPC ......... *G01R 33/5616* (2013.01); *G01R 33/243* (2013.01); *G01R 33/246* (2013.01)

(58) Field of Classification Search
USPC ....................................................... 324/309
See application file for complete search history.

(56) References Cited

U.S. PATENT DOCUMENTS 5,565,776 A * 10/1996 Kanazawa ....... G01R 33/56308
324/306
7,254,435 B2 * 8/2007 Zhang ................ G01R 33/5611
324/309

(Continued)

FOREIGN PATENT DOCUMENTS

JP          11-104107 A     4/1999
JP          2005-000270 A   1/2005

(Continued)

OTHER PUBLICATIONS

Yarnykh; "Actual Flip-Angle Imaging in the Pulsed Steady State: A Method for Rapid Three-Dimensional Mapping of the Transmitted Radiofrequency Field"; Magnetic Resonance in Medicine; Sep. 22, 2006; Wiley-Liss, Inc.

(Continued)

*Primary Examiner* — Rodney Fuller
(74) *Attorney, Agent, or Firm* — Cha & Reiter, LLC

(57) ABSTRACT

A method obtains main magnetic field information and radio frequency (RF) pulse related information in a magnetic resonance imaging (MRI) system, in which a pulse having a first flip angle and a pulse having a second flip angle are transmitted to a target object at predetermined time intervals. The method includes: obtaining at least one first response signal with respect to the pulse, having the first flip angle, from the target object; obtaining at least one second response signal, with respect to the pulse having the second flip angle, from the target object; and combining the at least one first response signal and the at least one second response signal to obtain the main magnetic field information and the RF pulse related information.

15 Claims, 6 Drawing Sheets

(56) References Cited

U.S. PATENT DOCUMENTS

| | | | |
|---|---|---|---|
| 7,511,490 B2* | 3/2009 | Abe | G01R 33/5613 324/307 |
| 7,511,493 B2* | 3/2009 | Green | G01R 33/5613 324/307 |
| 7,906,964 B2* | 3/2011 | Fleysher | G01R 33/54 324/307 |
| 2005/0240095 A1 | 10/2005 | Schaffter | |
| 2007/0210794 A1* | 9/2007 | Kabasawa | G01R 33/583 324/309 |
| 2008/0100292 A1* | 5/2008 | Hancu | G01R 33/246 324/307 |
| 2008/0116893 A1* | 5/2008 | Petersson | G01R 33/446 324/318 |
| 2011/0026799 A1 | 2/2011 | Nehrke et al. | |
| 2011/0156704 A1 | 6/2011 | Boernert et al. | |
| 2012/0212222 A1* | 8/2012 | Subramanian | G01R 33/5635 324/309 |
| 2013/0207653 A1* | 8/2013 | Ito | G01R 33/246 324/309 |
| 2013/0293231 A1* | 11/2013 | Hirai | A61B 5/055 324/309 |
| 2014/0152308 A1* | 6/2014 | Lee | G01R 33/246 324/309 |
| 2015/0042334 A1* | 2/2015 | Kannengiesser | G01R 33/3664 324/309 |

FOREIGN PATENT DOCUMENTS

| | | |
|---|---|---|
| JP | 2005-524453 A | 8/2005 |
| KR | 10-2012-0113356 A | 10/2012 |

OTHER PUBLICATIONS

Amadon, et al.; "Simultaneous measurement of B0- and B1-maps with modified Actual Flip Angle Imaging sequence"; Proc. Intl. Soc. Mag. Reson. Med.; 2008.

Nehrke; "On the Steady-State Properties of Actual Flip Angle Imaging (AFI)"; Magnetic Resonance in Medicine; Jan. 24, 2008; Wiley-Liss, Inc.

Lenz, et al.; "Simultaneous B1 and B0 Mapping Using Dual Echo Actual Flip Angle Imaging (DE-AFI)"; Proc. Intl. Soc. Mag. Reson. Med.; 2011.

* cited by examiner

METHOD AND APPARATUS FOR OBTAINING MAIN MAGNETIC FIELD INFORMATION AND RADIO PULSE RELATED INFORMATION IN A MAGNETIC RESONANCE IMAGING SYSTEM WITH DIFFERENT FLIP ANGLES

CLAIM OF PRIORITY

This application claims, pursuant to 35 USC 119(a), priority to and the benefit of the earlier filing date of Korean Patent Application No. 10-2013-0018238, filed on Feb. 20, 2013, in the Korean Intellectual Property Office, the entire disclosure of which is incorporated herein in its entirety by reference.

BACKGROUND

1. Field of the Invention

The present disclosure relates to a method and apparatus for obtaining main magnetic field information and radio frequency (RF) pulse related information in a magnetic resonance imaging (MRI) system using a pulse having different flip angles, and more particularly, to a method and apparatus for obtaining at least one response signal from a pulse having different flip angles, and combining the obtained response signals to thereby obtain main magnetic field information and RF pulse related information.

2. Description of the Related Art

Magnetic resonance imaging (MRI) refers to a technique of acquiring an image of a target object by locating the target object in a large area where a magnetic field is generated, generating radio frequency (RF) pulses to cause nuclei in the target object to resonate in order to measure a difference between signals emitted from tissue or the like of the target object, and re-constructing an image of the target object via a computer.

MRI provides images of high resolution and good contrast compared with other imaging techniques that use ultrasound or the like, and provides real-time deep organ images and three-dimensional (3D) information. Moreover, MRI is harmless to humans because there is no radiation exposure, and an axial image, a sagittal image, a coronal image, and the like may be obtained without changing the location of a target object.

SUMMARY

The present invention provides a method and apparatus for obtaining main magnetic field information and radio frequency (RF) pulse related information in a magnetic resonance imaging (MRI) system using a pulse having different flip angles.

According to an aspect of the present invention, there is provided a method of obtaining main magnetic field information and radio frequency (RF) pulse related information in a magnetic resonance imaging (MRI) system, in which a pulse having a first flip angle and a pulse having a second flip angle are transmitted to a target object at predetermined time intervals, the method including: obtaining at least one first response signal, with respect to the pulse having the first flip angle, from the target object; obtaining at least one second response signal, with respect to the pulse having the second flip angle, from the target object; and combining the at least one first response signal and the at least one second response signal to obtain the main magnetic field information and the RF pulse related information.

The first flip angle may be different from the second flip angle.

Each of the predetermined time intervals may include a repetition time (TR), which is a time interval at which the pulse having the first flip angle and the pulse having the second flip angle are applied, and the repetition time (TR) is variable.

The main magnetic field information may include information about an intensity of a main magnetic field of the MRI system, and the RF pulse related information may include at least one of intensity information and phase information of a magnetic field generated by an RF pulse that is applied to the target object.

The obtaining of the at least one first response signal with respect to the pulse having the first flip angle, from the target object, may include: transmitting the pulse having the first flip angle to the target object; receiving the at least one first response signal from the target object; and obtaining an amplitude of the received at least one first response signal.

The obtaining of the at least one second response signal with respect to the pulse having the second flip angle, from the target object, may include: transmitting at least one second response signal with respect to the pulse having the second flip angle, to the target object; receiving the at least one second response signal from the target object; and obtaining an amplitude and a phase of the received at least one second response signal.

The combining the at least one first response signal and the at least one second response signal to obtain the main magnetic field information and the RF pulse related information may include: obtaining intensity information of the magnetic field generated by the RF pulse that is applied to the target object by combining the obtained amplitude of the at least one first response signal and the obtained amplitude of the at least one second response signal; and combining a phase of the at least one second response signal with a phase of another second response signal to obtain the phase information of the magnetic field generated by the RF pulse and the intensity information of the main magnetic field.

According to another aspect of the present invention, there is provided an apparatus for obtaining main magnetic field information and radio frequency (RF) pulse related information in a magnetic resonance imaging (MRI) system, in which a pulse having a first flip angle and a pulse having a second flip angle are transmitted to a target object at predetermined time intervals, with the apparatus including: a response signal obtaining unit obtaining at least one first response signal, with respect to the pulse having the first flip angle, from the target object, and at least one second response signal, with respect to the pulse having the second flip angle, from the target object; and an information obtaining unit combining the at least one first response signal and the at least one second response signal to obtain the main magnetic field and the RF pulse related information.

The first flip angle may be different from the second flip angle.

Each of the predetermined time intervals may include a repetition time (TR), which is a time interval at which the pulse having the first flip angle and the pulse having the second flip angle are applied, and the repetition time (TR) is variable.

The main magnetic field information may include information about an intensity of a main magnetic field of the MRI system, and the RF pulse related information may include at least one of intensity information and phase information of a magnetic field generated by an RF pulse that is applied to the target object.

The response signal obtaining unit may include: a pulse transmitting unit transmitting the pulse having the first flip angle with respect to the target object; a pulse receiving unit receiving the at least one first response signal from the target object; and a first amplitude obtaining unit obtaining an amplitude of the received at least one first response signal.

The pulse transmitting unit may transmit the pulse having the second flip angle with respect to the target object, and the pulse receiving unit may receive the at least one second response signal from the target object, wherein the response signal obtaining unit further includes: a second amplitude obtaining unit obtaining an amplitude of the received at least one second response signal; and a phase obtaining unit obtaining a phase of the received at least one second response signal.

The information obtaining unit may include: an intensity information obtaining unit combining the obtained amplitude of the at least one first response signal and the obtained amplitude of the at least one second response signal to obtain intensity information of the magnetic field generated by the RF pulse that is applied to the target object; a phase information obtaining unit combining a phase of the at least one second response signal with a phase of another second response signal to obtain the phase information of the magnetic field generated by the RF pulse; and an intensity information obtaining unit obtaining information about the intensity information of the main magnetic field.

According to another aspect of the present invention, there is provided a non-transitory computer readable recording medium having embodied thereon a program for executing the method described above.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
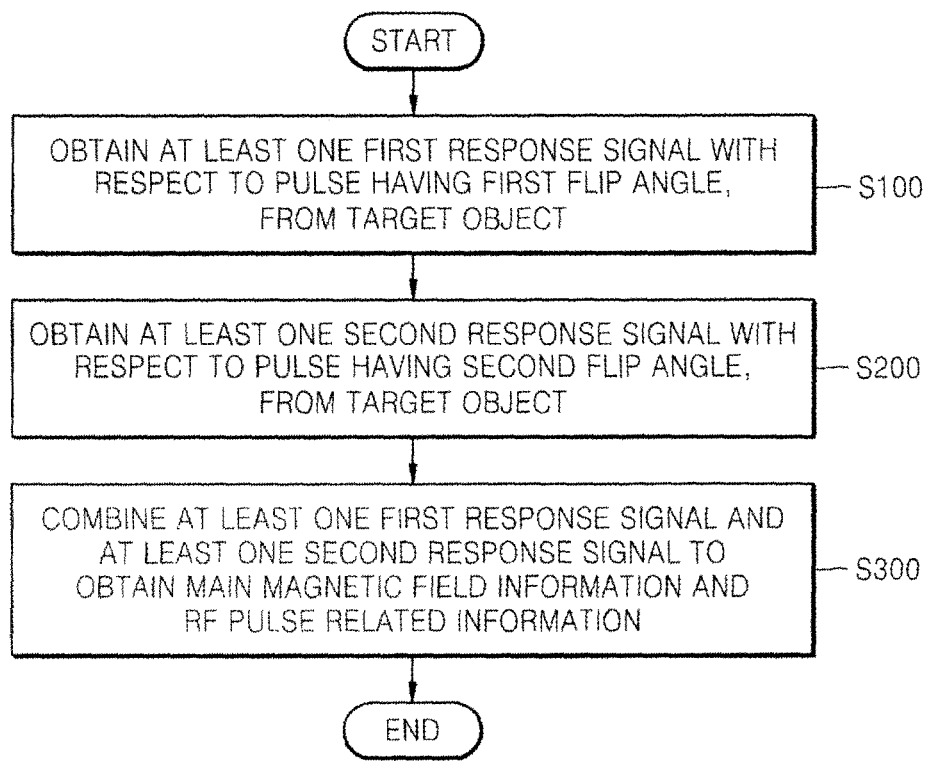
FIG. 1 is a flowchart illustrating a method of obtaining main magnetic field information and radio frequency (RF) pulse related information in a magnetic resonance imaging (MRI) system using a pulse having different flip angles, according to an exemplary embodiment of the present invention.

Exemplary embodiments of the present invention will be described with reference to the accompanying drawings. In the following description, a detailed explanation of known related functions and constructions may be omitted to avoid unnecessarily obscuring the subject matter of the present invention. The present invention may, however, be embodied in many different forms and should not be construed as limited to the exemplary embodiments set forth herein. In addition, terms described herein, which are defined with reference to the functions of the present invention, may be implemented differently depending on a user or operator's intention and practice. Therefore, the terms should be understood on the basis of the disclosure throughout the specification. The principles and features of the present invention may be employed in varied and numerous exemplary embodiments without departing from the scope of the present invention.

The same reference numbers are used throughout the drawings to refer to the same or like parts. Furthermore, although the drawings represent exemplary embodiments of the present invention, the drawings are not necessarily to scale and certain features may be exaggerated or omitted in order to more clearly illustrate and explain the present invention.

The terms used in the present specification are used for describing a specific exemplary embodiment, and not for limiting the present invention. Thus, the expression of singularity in the present specification includes the expression of plurality unless clearly specified otherwise in context. Unless defined otherwise, all terms used herein including technical or scientific terms have the same meanings as those generally understood by those skilled in the art to which the present invention may pertain. The terms as those defined in generally used dictionaries are construed to have meanings matching that in the context of related technology and, unless clearly defined otherwise, are not construed to be ideally or excessively formal.

When a part may "include" a certain constituent element, unless specified otherwise, it may not be construed to exclude another constituent element but may be construed to further include other constituent elements. The terms such as "portion", "unit", "module", etc. stated in the specification may signify a unit to process at least one function or operation and the unit may be embodied by hardware, software executed by hardware, or a combination of hardware and software.

The attached drawings for illustrating exemplary embodiments of the present invention are referred to in order to gain a sufficient understanding of the present invention, the merits thereof, and the target objectives accomplished by the implementation of the present invention. Hereinafter, the present invention will be described in more detail with reference to exemplary embodiments of the present invention and with reference to the attached drawings. To clearly describe the present invention, portions that are not related to the description of the present invention are omitted herein. Throughout the specification, like reference numerals in the drawings refer to like elements.

Expressions such as "at least one of", when preceding a list of elements, modify the entire list of elements and do not modify the individual elements of the list.

Throughout the specification, "magnetic resonance imaging (MRI)" refers to any known method for obtaining an image of a target object that is acquired via magnetic resonance imaging (MRI), also known as nuclear magnetic resonance (NMR), using magnetic resonance (MR) and image and signal processing methods known in the art.

Throughout the specification, a "user" may refer to a medical specialist, such as a doctor, nursing staff, a clinical pathologist, or a medical imaging specialist, but is not limited thereto.

Throughout the specification, a "target object" may refer to a portion or a whole of a human body. For example, the target object may be an organ such as a liver, a heart, a uterus, a brain, a breast or a stomach.

Also, a target object according to the exemplary embodiment of the present invention may include a phantom. A phantom refers to a material having a volume and a composition that is highly approximate to a density of an organism and having similar physical characteristics, so that a phantom according to the exemplary embodiment of the present invention may include a sphere-shaped phantom that has similar properties to those of a body or a portion of the body.

Throughout the specification, a "pulse sequence" refers to a continuation of signals that are repeatedly applied to a component in an MRI system. A pulse sequence may include time parameters of an RF pulse such as a repetition time (TR) and time to echo (TE).

A TR refers to a predetermined time interval at which a RF pulse is applied. For example, after applying a pulse having a flip angle of 90° in order to obtain a plurality of pieces of image information data corresponding to the number of phase encoding operations, another pulse having a flip angle of 90° is applied. A predetermined time interval at which the pulses as described above are applied may be referred to as a TR.

A TE refers to a predetermined period of time after which a response signal is obtained from a target object, as a response signal is not obtainable immediately after an RF pulse is applied to a target object. A TE may also be referred to as an echo delay time.

Throughout the specification, a "pulse sequence diagram" refers to an order of events that occur in an MRI system. In other words, a pulse sequence diagram refers to a diagram showing RF pulses, gradient magnetic fields, echo RF signals or the like according to a time flow.

Figure 6:
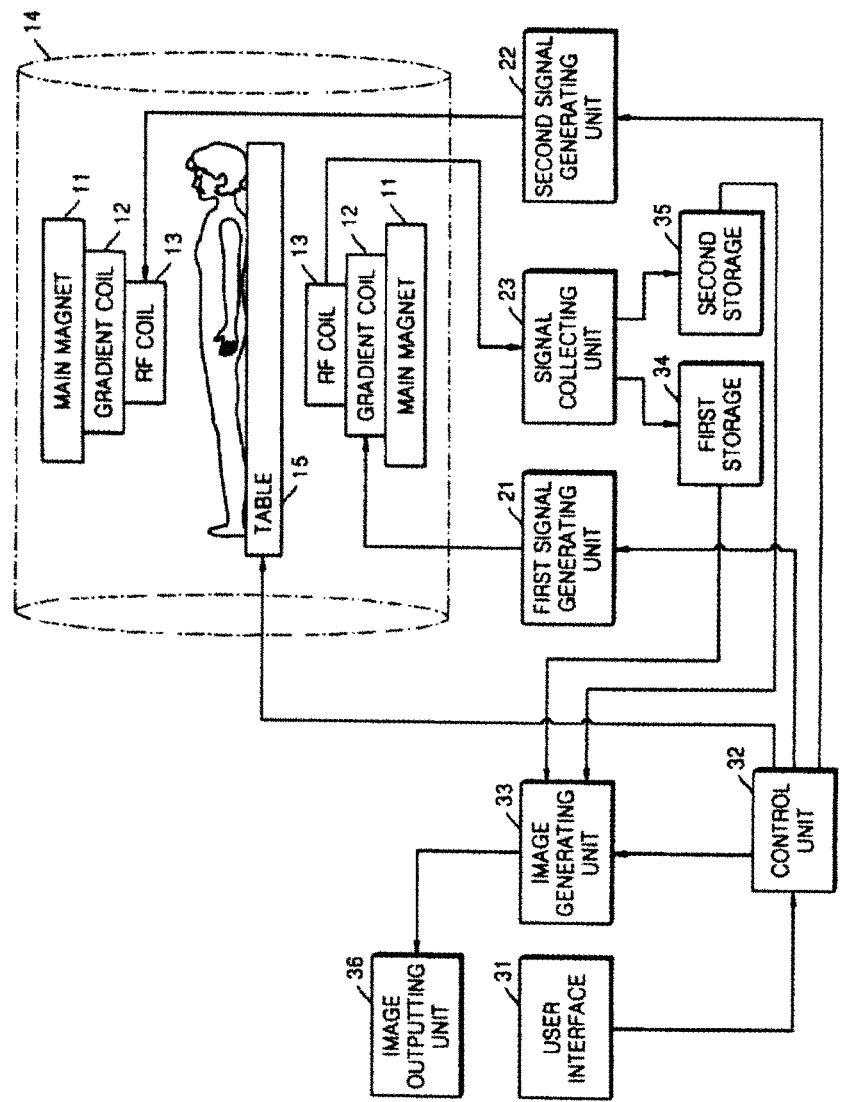
FIG. 6 is a block diagram of an MRI system used by the exemplary embodiment of the present invention.

An MRI system is a device that uses the principle of magnetic resonance (MR), also known as nuclear magnetic resonance (NMR), and is capable of locating a nucleus having a net magnetic moment (e.g., a nucleus having an odd number of protons or neutrons, such as a hydrogen atom nucleus), in a static background magnetic field, and is generated by the main magnet 11 in FIG. 6. The static background magnetic field may be referred to as a static magnetic field or a main magnetic field B0. The static background magnetic field may be uniform over the entire volume of a target object and may align a vast number of nucleus magnetic moments; that is, magnetic moments of nuclei in the target object, such as a patient disposed on the table 15 in FIG. 6.

A nucleus magnetic moment refers to axial rotation of an atomic nucleus at a frequency that is proportional to a magnetic field applied to the atomic nucleus located at a predetermined spatial position. For example, a Larmor angle frequency ω is determined by ω=γB. Here, γ represents a gyromagnetic ratio according to a nuclide and a structural environment thereof, and B represents an intensity of an applied magnetic field.

A predetermined nuclide may have a common Larmor rotational frequency under a common physical environment. However, due to, for example, overlapping of auxiliary magnetic fields having a linear gradient (e.g., one of three crossing directions x, y, and z), a Larmor frequency of a nuclide may have different values according to a magnitude of a magnetic field having a linear gradient at a spatial position of a nucleus.

The overlapping gradient magnetic fields, generated by the gradient coil 12 in FIG. 6, may have a linear gradient magnetic field only along one of the three crossing directions x, y, and z, but may be uniform in other directions. In general, the MRI system may include three gradient magnetic field coils in the gradient coil 12 that are disposed to apply a linear gradient magnetic field in the three different crossing directions.

A nucleus magnetic moment may be nutated, for example, to precess in a static magnetic field B0 by selectively exciting a nucleus in a predetermined volume (e.g., a slice) of a target object by transmitting an RF magnetic field from the RF coil 13 in FIG. 6, with the RF magnetic field having a Larmor frequency, towards the target object. In other words, a magnetic field of an atomic nucleus may be nutated by a predetermined amount (e.g., by 90° or 180°) according to an amplitude and continued application time of an RF pulse needed to excite the nucleus.

A nucleus magnetic moment, which is excited to be in nutating motion, may be relaxed toward the static magnetic field B0 according to its specific vertical axis relaxation time T1 and its specific horizontal axis relaxation time T2. In a relaxation operation as above, a magnetic moment of an atomic nucleus may emit an RF response signal (e.g., an RF response signal related to an excitation RF magnetic field or other NMR nucleus radiation RF response signals), from which an RF signal having predetermined amplitude, frequency, and phase may be detected by the signal collecting unit 23 in FIG. 6.

By appropriately selecting a predetermined MRI sequence including gradient magnetic field pulses and RF excitation pulses, an RF response signal that is spatially encoded may be induced. By using the induced RF response signal, an image or a map showing an atomic nucleus density of a portion or the whole of a slice of an image of a target object may be generated by the image generating unit 33, and the image may be output, for example, to be displayed by the image outputting unit 36 in FIG. 6.

Main magnetic field B0 mapping is a method used to measure a distribution of a main magnetic field at which a target object is located. A B0 map obtained as a result of B0 mapping may be used in correcting for the loss of a response signal due to entrance of the target object in the main magnetic field or irregularity of the main magnetic field due to an RF pulse or the like.

The B0 map may be obtained from two images by differentiating TEs and using a phase difference between the two obtained images.

An MRI system is formed of a magnet, such as the main magnet 11 in FIG. 6, having a magnetic force of a predetermined intensity, and the intensity of the magnet determines an intensity of a main magnetic field. If a target object enters inside the MRI system, for example, into the bore of the MRI system by being moved in and out of the bore by the table 15, the intensity of the main magnetic field of the inside of the bore may vary according to insertion of the target object in the bore.

Accordingly, individual main magnetic fields are to be corrected (e.g., shimming) according to a target object in order to maintain a uniform main magnetic field. As described above, the B0 map may be used in a correcting operation.

As described above, after excitation, by analyzing a signal emitted during relaxation, a distribution of a magnetic field due to an RF pulse applied to a target object may be detected. In other words, as a method of measuring a distribution of a magnetic field (e.g., RF field) due to an external radio pulse applied to a target object, B1 mapping is available.

In a B1 mapping method according to the prior art, an actual flip angle imaging (AFI) method is available. According to the AFI method, an excitation pulse having two identical flip angles at the same time is used to obtain a 3D image, and a B1 amplitude map is obtained. For example, two different TRs may be used to obtain two normal state signals and obtain a B1 map based on a ratio of the signals.

The B1 map may be used to correct irregular application of an excitation pulse to a target object.

In order to obtain an MR image using the MRI system of FIG. 6, a magnetic field having the same frequency as that of a main magnetic field is applied from the outside of a target object. The higher the intensity of the main magnetic field, the higher a frequency of an external magnetic field, and the shorter a wavelength of the external magnetic field. When the external magnetic field passes through the target object, a wavelength of the external magnetic field may shorten to the similar wavelength as that of the target object due to electromagnetic properties of the target object. Reduction in the wavelength of the external magnetic field may intensify irregularity of the external magnetic field applied to the target object, and thus, the irregularity may decrease quality of the MR image. Accordingly, the external magnetic field has to be corrected.

Also, as an MRI system with a main magnetic field of a high intensity is preferred since a high signal-to-noise ratio (SNR) may be achieved, correction of irregularity of the external magnetic field (e.g., B1 shimming) is further necessary.

While B1 amplitude mapping is generally frequently performed, the utility and importance of B1 phase mapping have increased due to the advance of parallel transmit RF coils as the RF coil 13. For example, relatively accurate quantification regarding specific absorption rates (SAR) is possible based on B1 phase information.

According to the prior art, a method of obtaining B1 phase information is not known, and so instead, a phase of a spin echo image or a phase of a balanced steady state free precession image has been used in MRI processes.

According to the exemplary embodiment of the present invention, a pulse having different flip angles is transmitted to a target object, and at least one response signal obtained from the target object is combined with each other to obtain both a B0 map and a B1 map at the same time.

In other words, according to the prior art, a B0 map and a B1 map are individually obtained by scanning the target object at least three times. However, according to the exemplary embodiment of the present invention, a B0 map and a B1 map may be obtained simultaneously. Also, as the number of times of scanning is reduced compared to the prior art, time for data processing may be reduced.

Also, while only B1 amplitude information is obtainable as a B1 map according to the prior art, according to the exemplary embodiment of the present invention, up to date and accurate B1 phase information may be obtained.

In addition, according to the exemplary embodiment of the present invention, by providing an RF pulse having different flip angles, an SNR between a B0 map and a B1 map may be improved. For example, an SNR of a response signal may be improved by optimizing a ratio of flip angles of RF pulses used at TR1 and TR2. In other words, by adjusting a ratio of flip angles, the accuracy of the B0 map and the B1 map may be improved.

As shown in FIG. 6, the magnetic resonance imaging (MRI) apparatus and system of the present invention may implement the method and the various components of the present invention. The MRI apparatus of FIG. 6 may include a magnet assembly 14 having a generally cylindrical shape with a hollow bore having a longitudinal axis, into which at least a portion of a subject, such as a patient, is disposed, for example, on a table 15 which may move the patient into and out of the bore. The magnet assembly 14 has at least one main magnet 11, at least one gradient coil 12, and at least one radio frequency (RF) coil 13 disposed around the bore for generating a magnetic field and for receiving an RF signal from the patient or a portion thereof, in a manner known in the art for performing MRI.

The main magnet 11 generates a main magnetic field, and a first signal generating unit 21 controls the gradient coil 12 to generate gradient magnetic fields. The second signal generating unit 22 controls the RF coil 13 to generate RF signals emitted to the patient or a portion thereof, and a signal collecting unit 23 receives RF signals from the patent or a portion thereof. At least one of a first storage 34 and a second storage 35 are used to receive and at least temporarily store the received RF signals as MRI data, which are sent to an image generating unit 33. A user interface 31 allows a user, such as a technician, diagnostician, or medical staff to control and send commands to a control unit 32 which controls the signal generating units 21, 22 and the image generating unit 33. Using the received RF signals, the image generating unit 33 generates an MR image of the patent or a portion thereof, which is output by an image outputting unit 36, which may be a display, or which may transmit the image to a network to other facilities or devices in communication with the MRI apparatus, or the image may be transmitted to another storage which may be external to the MRI apparatus.

FIG. 1 is a flowchart illustrating a method of obtaining main magnetic field information and RF pulse related information in an MRI system using a pulse having different flip angles and using the MRI apparatus and system of FIG. 6, according to the exemplary embodiment of the present invention.

The method obtains main magnetic field information and RF pulse related information in an MRI system in which a pulse having a first flip angle and a pulse having a second flip angle are transmitted to a target object at predetermined time intervals. As shown in FIG. 1, the method of the present invention may include the step S100 of obtaining at least one first response signal, with respect to a pulse having a first flip angle, from a target object; the step S200 of obtaining at least one second response signal, with respect to a pulse having a second flip angle, from the target object; and the step S300 of combining the at least one first response signal and the at least one second response signal to obtain main magnetic field information and RF pulse related information. Step S300 may further include the steps of adjusting the operations of the control unit 32, as described herein, using the obtained the main magnetic field information and the RF pulse related information, and also generating and displaying an MR image of the target object using the adjusted control unit 32. The step of generating the MR image is performed by the image generating unit 33 in FIG. 6, and the step of displaying the MR image is performed by the image outputting unit 36 in FIG. 6.

Figure 2:
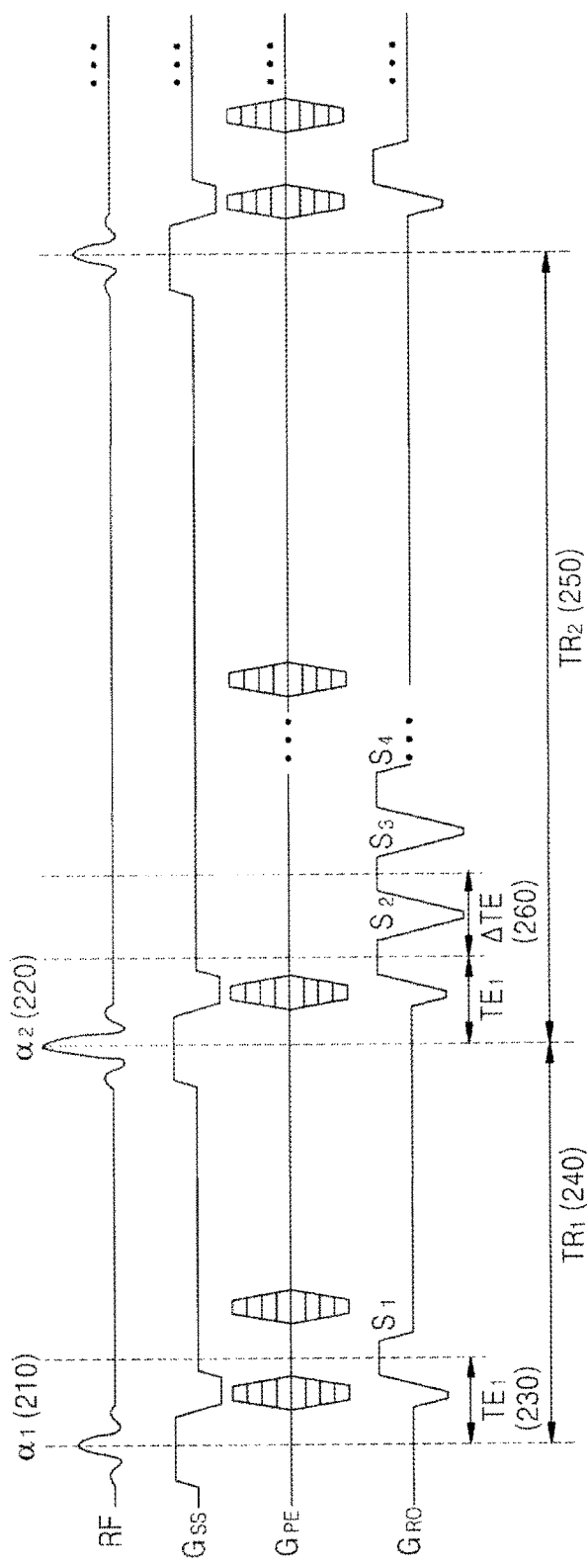
FIG. 2 is a diagram of a pulse sequence according to the exemplary embodiment of the present invention.

FIG. 2 is a diagram of a pulse sequence according to the exemplary embodiment of the present invention.

The line labeled RF may refer to an RF pulse applied to a target object, and the line $G_{RO}$ may refer to a response signal (for example, an echo signal).

A first flip angle $\alpha_1$ 210 and a second flip angle $\alpha_2$ 220 according to the exemplary embodiment of the present invention may be set to be different from each other.

For example, by using a ratio of different flip angles, the accuracy of main magnetic field information or RF pulse related information may be adjusted. For example, by differentiating combinations of respective flip angles, an SNR of a main magnetic field related signal or an RF pulse related signal may be adjusted. This will be described later with reference to Equations (1) and (2) in regard to FIG. 3.

A predetermined time interval according to the exemplary embodiment of the present invention may include a TR which refers to a time interval at which a pulse having the first flip angle 210 and a pulse having the second flip angle 220 are applied.

A TR may be variably set in a series of pulse sequences according to the exemplary embodiment of the present invention. For example, a time interval TR1 240 between a pulse having the first flip angle 210 and a pulse having the second flip angle 220 that is applied after the pulse having the first flip angle 210 may be different from a time interval TR2 250 between a pulse having the second flip angle 220 and a pulse having the first flip angle 210 that is applied again after the pulse having the second flip angle 220.

By differentiating the TR1 240 and the TR2 250 according to the exemplary embodiment of the present invention, the accuracy of the B1 amplitude information may be adjusted.

The main magnetic field information according to the exemplary embodiment of the present invention may include information about an intensity of a main magnetic field B0 of the MRI system, such as the magnetic field generated by the main magnet 11. Information about an intensity of a main magnetic field B0 may be expressed as an amplitude map of the main magnetic field B0.

The RF pulse related information according to the exemplary embodiment of the present invention may include at least one of intensity information and phase information of a magnetic field B1 generated by an RF pulse applied to a target object by the RF coil 13. Intensity information of the magnetic field B1 generated by an external RF pulse may be expressed as a B1 amplitude map. Phase information of a magnetic field B1 that is generated by an external radio pulse may be expressed as a B1 phase map. Referring to FIG. 1, the step S100 of obtaining at least one first response signal with respect to a pulse having a first flip angle from a target object may include additional steps, including: the step S110 of transmitting a pulse, having a first flip angle, to a target object; the step S120 of receiving at least one response signal from the target object; and the step S130 of obtaining an amplitude of the received at least one response signal.

In the step S110, a pulse having the first flip angle 210 may be transmitted to the target object.

In the step S120, at least one first response signal $S_1$ may be received from the target object, as shown in FIG. 2. An external RF pulse having the first flip angle 210 may be transmitted to the target object, and after a time to echo $TE_1$ 230, at least one first response signal $S_1$ may be received.

In the step S130, an amplitude of the received at least one first response signal $S_1$ may be obtained.

Referring to FIG. 1, the step S200 of obtaining at least one second response signal with respect to a pulse having a second flip angle from the target object may include additional steps, including: the step S210 of transmitting at least one second response signal, with respect to a pulse having a second flip angle, to the target object; the step S220 of receiving at least one second response signal from the target object; and the step S230 of obtaining an amplitude and a phase of the received at least one second response signal.

In the step S210, a pulse having the second flip angle 220 with respect to the target object may be transmitted. In the step S220, at least one second response signal, e.g., $S_2$ through $S_4$ in FIG. 2, may be received from the target object.

As a TR in response to the pulse having the second flip angle 220 is longer than a TR in response to the pulse having the first flip angle 210, a time for obtaining a response signal is long enough, and accordingly, a plurality of response signals may be received with respect to the second flip angle 220.

Also, a plurality of response signals may be received with respect to each of the flip angles 210 and 220 since an SNR increases as a plurality of response signals are further obtained.

A pulse having the second flip angle 220 may be transmitted to the target object, and the at least one second response signal may be received after a predetermined time to echo TE. The predetermined time to echo TE at which the at least one second response signal is received may be the same as or different from a $TE_1$ at which at least one first response signal is received. Also, the second response signals $S_2$ through $S_4$ may be received at the same or different TE intervals $\Delta TE$ 260.

In the step S230, an amplitude and a phase of the received at least one second response signal may be obtained.

At least one of the amplitude and a phase of the received second response signals (e.g., $S_2$ through $S_4$) may be obtained during the same or different TE interval $\Delta TE$ 260.

Figure 3:
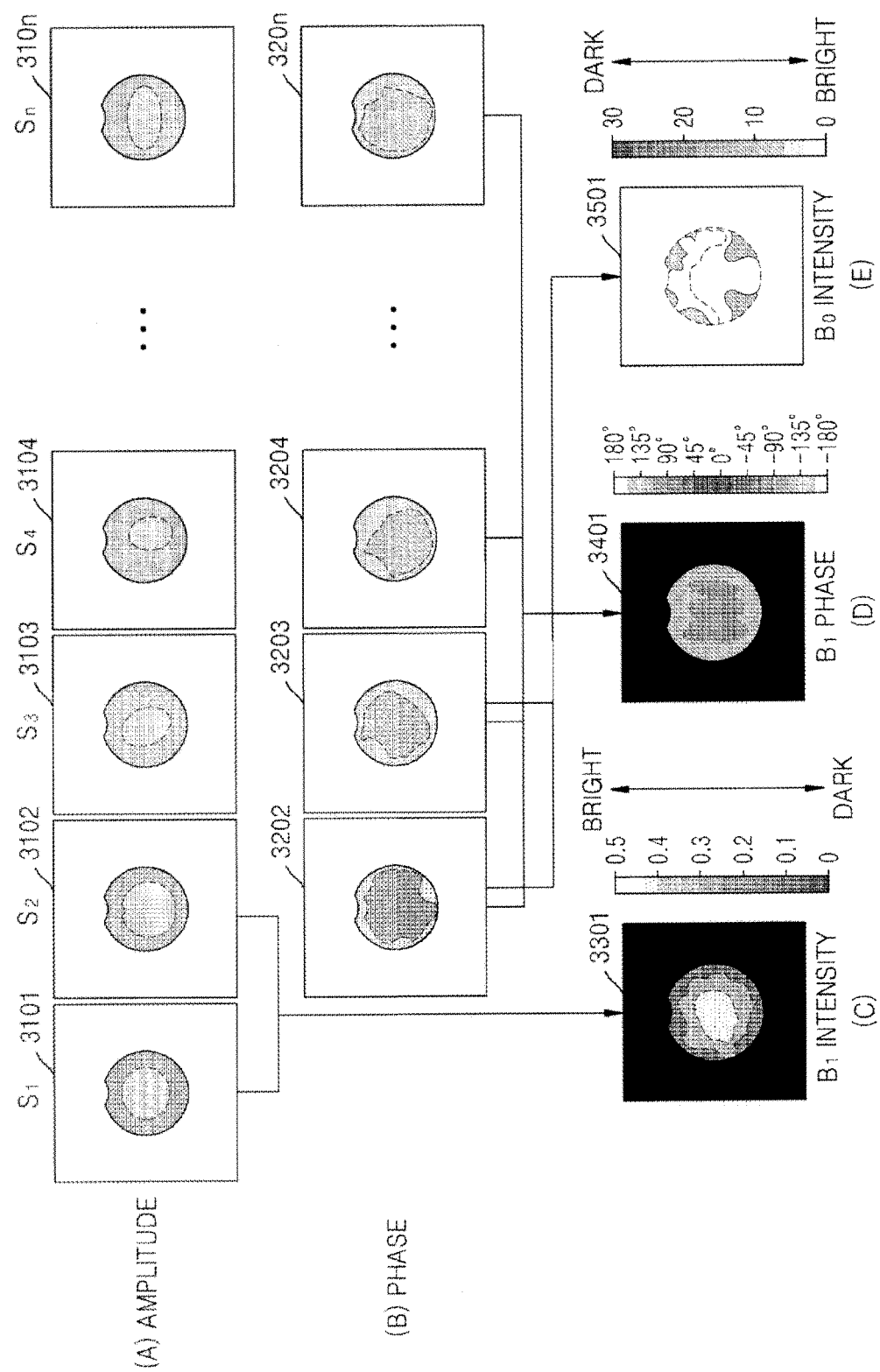
FIG. 3 illustrates main magnetic field information and RF pulse related information according to the exemplary embodiment of the present invention.

FIG. 3 illustrates main magnetic field information and RF pulse related information according to the exemplary embodiment of the present invention.

According to the exemplary embodiment of the present invention, information about the amplitude may be obtained from at least one first response signal with respect to a pulse having a first flip angle. For example, regarding a sphere-shaped phantom, amplitude 3101 of a first response signal may be obtained. The amplitude information 3101 may be expressed as a map or the like, as illustrated in the first set (A) of images in FIG. 3.

Also, according to the exemplary embodiment of the present invention, an amplitude and a phase of at least one second response signal with respect to a pulse having a second flip angle may be obtained. For example, regarding sphere-shaped phantoms, amplitudes 3102 through 310*n* and phases 3202 through 320*n* of the at least one second response signal may be obtained. The amplitudes and phases of the at least one second response signal may be expressed as a map or the like as illustrated in the first set (A) of images and the second set (B) of images in FIG. 3.

Referring back to the step S300 in FIG. 1 of combining the at least one first response signal and the at least one second response signal to obtain main magnetic field information and RF pulse related information, the step S300 may include additional steps, including: a step S310 of obtaining intensity information of a magnetic field generated by a RF pulse, by combining an amplitude of at least one first response signal and an amplitude of the at least one second response signal; and the step S320 of combining a phase of the at least one second response signal with a phase of another second response signal to obtain phase information of a magnetic field generated by an RF pulse and an intensity information of a main magnetic field. The step of combining amplitude information and combining phase information may be performed by known data combining methods, such as simple summation of data values, by convolution, or by other data combination as well as signal and image processing methods known in the art.

For example, referring to FIG. 3, in the step S310, the amplitude 3101 of the first response signal and the amplitude 3102 of the second response signal may be combined to obtain intensity information 3301 of a magnetic field generated by an RF pulse, as illustrated in the image labeled (C) in FIG. 3. In this manner, the amplitude 3101 of the first response signal and the amplitudes 3102 through 310n of the second response signals may be combined, for example, using a processor of the control unit 32 of FIG. 6, to obtain intensity information 3301 of a magnetic field generated by an RF pulse.

For example, if the second flip angle 220 is twice as large as the first flip angle 210 (for example, if $\alpha_2 = 2\alpha_1$), intensity information of a magnetic field B1 generated by an external RF pulse may be obtained according to Equations (1) through (5) below.

$$M_{z1} = M_0 \frac{1 - E_2 + (1 - E_1)E_2 \cos\alpha_2}{1 - E_1 E_2 \cos\alpha_1 \cos\alpha_2} \quad (1)$$

$$M_{z2} = M_0 \frac{1 - E_1 + (1 - E_2)E_1 \cos\alpha_1}{1 - E_1 E_2 \cos\alpha_1 \cos\alpha_2} \quad (2)$$

where $E_1 = \exp(-TR_1/T_1)$, $E_2 = \exp(-TR_2/T_1)$, and $\alpha_2 = 2\alpha_1$;

$$S_{1,2} = M_{z1,2} \exp\left(-\frac{TE}{T_2^*}\right) \sin\alpha_{1,2} \quad (3)$$

$$r = \frac{S_2}{S_1} = \left(\frac{1 - E_1 + (1 - E_2)E_1 \cos\alpha_1}{1 - E_2 + (1 - E_1)E_2 \cos\alpha_2}\right) 2\cos\alpha_1 \quad (4)$$

so therefore $$\alpha_1 = \cos^{-1}\left(\frac{1 - \sqrt{1 - 2(r-n)r(n-1)}}{2(r-n)}\right) \quad (5)$$

where, for example, $n = TR_2/TR_1 = 5$.

Regarding respective different flip angles, intensity information of a magnetic field B1 generated by an external RF pulse may be obtained by using Equations (1) through (5) described above, for example, using the processor of the control unit 32 of FIG. 6.

For example, by adjusting a ratio of a second flip angle with respect to a first flip angle, an SNR of a signal regarding main magnetic field information or RF pulse related information may be adjusted, for example, using the processor of the control unit 32 of FIG. 6.

The intensity information of a magnetic field generated by the above-described RF pulse may be expressed, for example, by a B1 intensity map. For example, a portion of a response signal, that corresponds to a target object and has a large amplitude, is a portion where the intensity of an external magnetic field is high, and the portion may be expressed brightly with lighter pixels in the images in FIG. 3. On the other hand, a portion of the response signal that has a small amplitude is a portion where intensity of an external magnetic field is low, and the portion may be expressed as dark pixels in the images in FIG. 3. However, such representations of the images by various coloring of pixels in the exemplary embodiments of the present invention are not limited thereto.

In the step S320, at least one second response signal may be combined to obtain phase information of a magnetic field generated by an RF pulse. For example, by combining phases 3202 through 320n of at least one second response signal, phase information 3401 generated by an RF pulse may be obtained, for example, using the processor of the control unit 32 of FIG. 6. The phase information 3401 may be expressed as a B1 phase map or the like, as shown in the image labeled (D) in FIG. 3.

For example, phase information by an external RF pulse may be obtained according to Equations (6) and (7) below.

$$\varphi(x, y, z) = -\gamma \Delta B_0 t + \varphi_0(x, y, z) \quad (6)$$

$$\begin{bmatrix} -\gamma \Delta B_0 \\ \varphi_0 \end{bmatrix} = \begin{bmatrix} TE_1 & 1 \\ TE_2 & 1 \\ \vdots & \vdots \\ TE_N & 1 \end{bmatrix}^{-1} \cdot \begin{bmatrix} \varphi_1 \\ \varphi_2 \\ \vdots \\ \varphi_N \end{bmatrix}, TE_i = TE_1 + (i-1) \cdot \Delta TE \quad (7)$$

where $i \geq 2$.

In Equation (6), $\gamma$ represents a gyromagnetic ratio, $\Delta B_0$ represents a magnetic inhomogeneity, and $\phi_0$ represents a phase when TE=0.

After expressing Equation (6) as a matrix with respect to at least one second response signal and then arranging the matrix by using a linear least square method, Equation (6) may be expressed as Equation (7) above. A value $\phi_0$ obtained from Equation (7) may represent phase information due to an external RF pulse, with Equations (6) and (7) applied, for example, using the processor of the control unit 32 of FIG. 6.

Also, in step S320, a phase of the at least one second response signal may be combined with a phase of another second response signal to obtain information regarding an intensity of a main magnetic field. For example, by combining at least two phases 3202 and 3203, information 3501 about an intensity of a main magnetic field may be obtained, as shown in the image labeled (E) of FIG. 3, for example, using the processor of the control unit 32 of FIG. 6. The information 3501 regarding a main magnetic field may be expressed as a B0 map or the like. As illustrated in the image labeled (E) of FIG. 3, an intensity of a main magnetic field may be expressed by various luminance values.

For example, information about an intensity of a main magnetic field may be obtained by Equation (8) below.

$$f = \frac{\angle S_3 - \angle S_2}{\Delta TE} \quad (8)$$

Here, $\angle$ represents a phase of a response signal, and f represents information about an intensity of a main magnetic field, with Equations (8) applied, for example, using the processor of the control unit 32 of FIG. 6.

Figure 4:
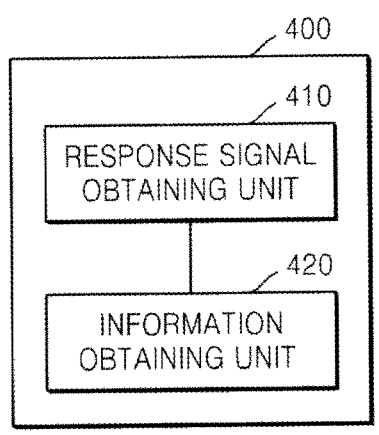
FIG. 4 is a schematic block diagram illustrating an apparatus for obtaining main magnetic field information and RF pulse related information in an MRI system using a pulse having different flip angles, according to the exemplary embodiment of the present invention.

FIG. 4 is a schematic block diagram illustrating an apparatus 400 for obtaining main magnetic field information and RF pulse related information in an MRI system having different flip angles, according to the exemplary embodiment of the present invention. The apparatus 400 may be implemented, for example, in the control unit 32 of FIG. 6 or by a combination of components of the MRI system of FIG. 6.

The apparatus 400 for obtaining main magnetic field information and RF pulse related information in an MRI system, in which a pulse having a first flip angle and a pulse having a second flip angle are transmitted to a target object at predetermined time intervals, may include a response signal obtaining unit 410 and an information obtaining unit 420.

The response signal obtaining unit 410 may obtain at least one first response signal, with respect to a pulse having a first flip angle, from a target object, and at least one second response signal, with respect to a pulse having the second flip angle, from the target object.

The information obtaining unit 420 may combine the at least one first response signal and the at least one second response signal to obtain main magnetic field information and RF pulse related information, as described in connection with FIG. 3.

The first flip angle and the second flip angle according to the exemplary embodiment of the present invention may be set differently.

The predetermined time interval according to the exemplary embodiment of the present invention may include a repetition time (TR), which is a time interval at which each of a pulse having a first flip angle and a pulse having a second flip angle is applied. In addition, the repetition time TR may be set variably; that is, to be adjusted automatically by the control unit 32 in FIG. 6, or adjusted by manual input, for example, using the user interface 31 in FIG. 6.

The main magnetic field according to the exemplary embodiment of the present invention may include information about an intensity of a main magnetic field of an MRI system, and RF pulse related information may include at least one of intensity information and phase information of a magnetic field that is generated by an RF pulse applied to a target object.

Figure 5:
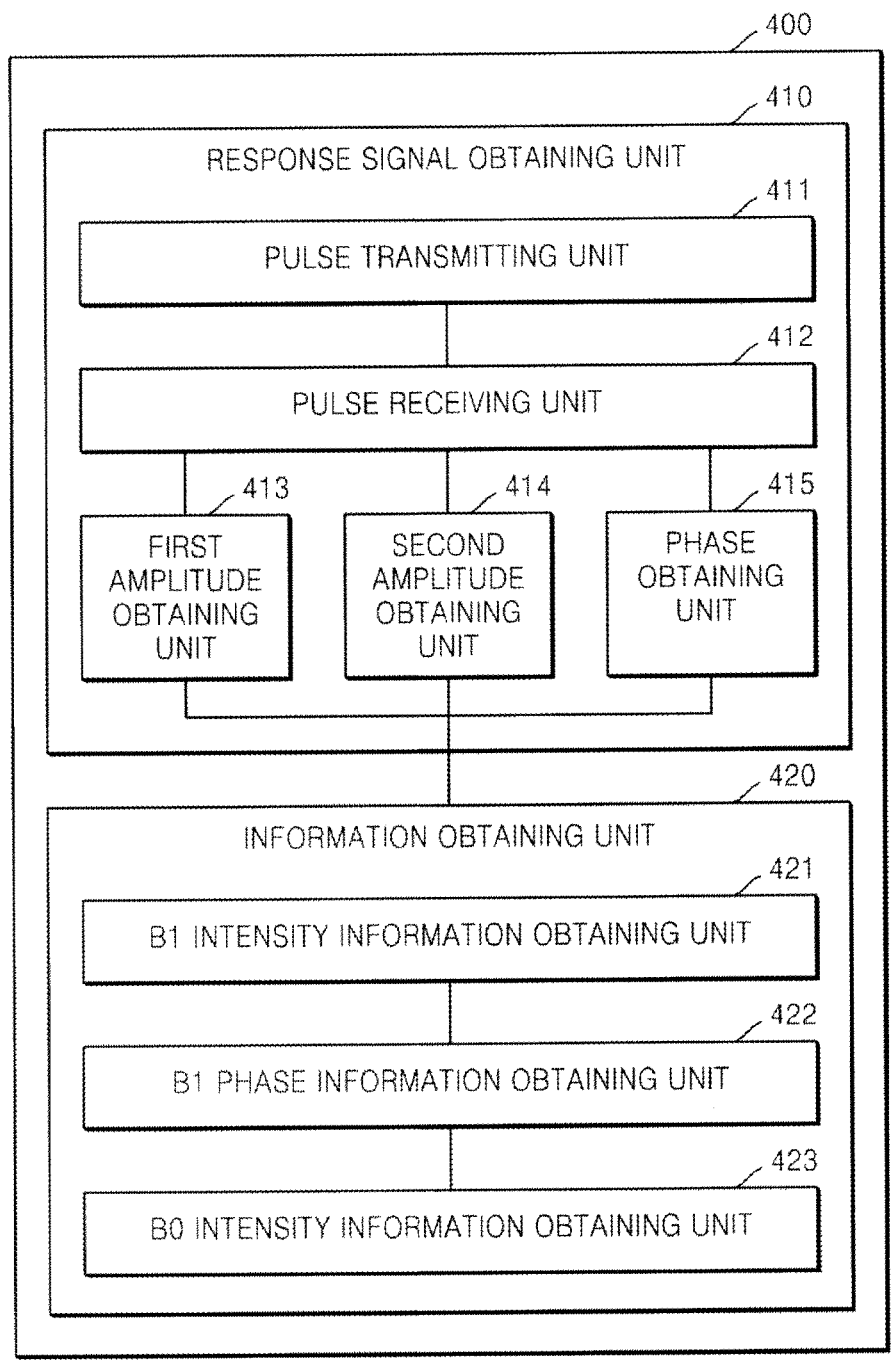
FIG. 5 illustrates the apparatus of FIG. 4 in greater detail for obtaining main magnetic field information and RF pulse related information according to the exemplary embodiment of the present invention.

FIG. 5 illustrates the apparatus 400 of FIG. 4 in greater detail for obtaining main magnetic field information and RF pulse related information according to the exemplary embodiment of the present invention.

A response signal obtaining unit 410 according to the exemplary embodiment of the present invention may include a pulse transmitting unit 411, a pulse receiving unit 412, and a first amplitude obtaining unit 413.

The pulse transmitting unit 411 may be implemented by the first signal generating unit 21 in FIG. 6, and may transmit a pulse having a first flip angle with respect to a target object. The pulse receiving unit 412 may receive at least one first response signal from the target object, and may be implemented by the signal collecting unit 23 in FIG. 6.

The first amplitude obtaining unit 413 may obtain an amplitude of the received at least one first response signal, and may be implemented by the control unit 32 in FIG. 6.

The response signal obtaining unit 410 according to the exemplary embodiment of the present invention may further include a second amplitude obtaining unit 414 and a phase obtaining unit 415, which may be control unit 32 in FIG. 6.

The pulse transmitting unit 411 may transmit a pulse having a second flip angle with respect to the target object, and the pulse receiving unit 412 may receive at least one second response signal from the target object.

The second amplitude obtaining unit 414 may obtain an amplitude of the received at least one second response signal, and the phase obtaining unit 415 may obtain a phase of the received at least one second response signal.

The information obtaining unit 420 may include a B1 intensity information obtaining unit 421, a B1 phase information obtaining unit 422, and a B0 intensity information obtaining unit 423.

The B1 intensity information obtaining unit 421 may combine the amplitude of at least one first response signal and the amplitude of at least one second response signal to obtain intensity information of a magnetic field generated by an RF pulse, as described in connection with generating the image 3301 in FIG. 3.

The B1 phase information obtaining unit 422 may combine a phase of at least one second response signal with a phase of another second response signal to obtain phase information of a magnetic field generated by an RF pulse, as described in connection with generating the image 3401 in FIG. 3.

The B0 intensity information obtaining unit 423 may obtain information about an intensity of a main magnetic field, as described in connection with generating the image 3501 in FIG. 3.

Using the obtained B1 intensity information, the B1 phase information, and the B0 intensity information, the MRI system of FIG. 6, and in particular the control unit 32, may adjust the operations of the first signal generating unit 21 to correct for irregular application of an excitation pulse to a target object, and the MRI system of FIG. 6, and in particular the control unit 32 may adjust operations of the main magnet 11 to correct the external magnetic field. Accordingly, with such adjustments and corrections, the MR images of the target object which are generated by the image generating unit 32 and displayed by the image outputting unit 36 will have greater accuracy.

The description of the above-described method may be applied to an apparatus according to the exemplary embodiment of the present invention. Thus, the same description of the apparatus as described with reference to the above-described method is omitted here.

The exemplary embodiments of the present invention can be written as computer programs that can be implemented in general-use digital computers that execute the programs using a non-transitory computer readable recording medium.

Examples of the non-transitory computer readable recording medium include read-only memory (ROM), random-access memory (RAM), CD-ROMs, magnetic tapes, floppy disks, optical data storage devices, etc. (e.g., transmission through the Internet).

The above-described apparatus and methods according to the present invention can be implemented in hardware or firmware, or as software or computer code, or combinations thereof. Various components such as a controller, a central processing unit (CPU), a processor, and any unit or device described herein includes at least hardware and/or other physical structures and elements. In addition, the software or computer code can also be stored in a non-transitory recording medium such as a CD ROM, a RAM, a ROM whether erasable or rewritable or not, a floppy disk, CDs, DVDs, memory chips, a hard disk, a magnetic storage media, an optical recording media, or a magneto-optical disk or computer code downloaded over a network originally stored on a remote recording medium, a computer readable recording medium, or a non-transitory machine readable medium and to be stored on a local recording medium, so that the methods described herein can be rendered in such software, computer code, software modules, software objects, instructions, applications, applets, apps, etc. that is stored on the recording medium using a general purpose computer, a digital computer, or a special processor or in programmable or dedicated hardware, such as an ASIC or FPGA. As would be understood in the art, the computer, the processor, microprocessor controller or the programmable hardware include volatile and/or non-volatile storage and memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, the program may be electronically transferred through any medium such as communication signals transmitted by wire/wireless connections, and their equivalents. The programs and computer readable recording medium can also be distributed in network-coupled computer systems so that the computer readable code is stored and executed in a distributed fashion.

While the present invention has been particularly shown and described with reference to exemplary embodiments thereof, it will be understood by those of ordinary skill in the art that various changes in form and details may be implemented therein without departing from the spirit and scope of the present invention as defined by the appended claims. The exemplary embodiments should be considered in a descriptive sense only and not for purposes of limitation. Therefore, the scope of the present invention is defined not by the detailed description of the present invention but by the appended claims, and all differences within the scope will be construed as being included in the present invention.

What is claimed is:

1. A method of obtaining main magnetic field information and radio frequency (RF) pulse related information in a magnetic resonance imaging (MRI) system, the method comprising:
   providing a pulse sequence comprising a pulse having a first flip angle and a pulse having a second flip angle;
   obtaining at least one first response signal, with respect to the pulse having the first flip angle, from a target object;
   obtaining at least one second response signal, with respect to the pulse having the second flip angle, from the target object; and
   generating information of the main magnetic field and information of the magnetic field generated by the RF pulse, based on the at least one first response signal and the at least one second response signal.

2. The method of claim 1, wherein the first flip angle is different from the second flip angle.

3. The method of claim 1, wherein each of predetermined time intervals comprises a repetition time (TR), which is a time interval at which the pulse having the first flip angle and the pulse having the second flip angle are applied, and the repetition time (TR) is variable.

4. The method of claim 1, wherein the information of the main magnetic field comprises information about an intensity of the main magnetic field of the MRI system, and the information of the magnetic field generated by the RF pulse comprises at least one of intensity information and phase information of the magnetic field generated by an RF pulse that is applied to the target object.

5. The method of claim 4, wherein the obtaining of the at least one first response signal, with respect to the pulse having the first flip angle, from the target object, comprises:
   transmitting the pulse, having the first flip angle, to the target object;
   receiving the at least one first response signal from the target object; and
   obtaining an amplitude of the received at least one first response signal.

6. The method of claim 5, wherein the obtaining of the at least one second response signal, with respect to the pulse having the second flip angle, from the target object, comprises:
   transmitting at least one second response signal, with respect to the pulse having the second flip angle, to the target object;
   receiving the at least one second response signal from the target object; and
   obtaining an amplitude and a phase of the received at least one second response signal.

7. The method of claim 1, wherein the generating information of the main magnetic field and information of the magnetic field generated by the RF pulse comprises:
   obtaining intensity information of the magnetic field generated by the RF pulse that is applied to the target object by combining the obtained amplitude of the at least one first response signal and the obtained amplitude of the at least one second response signal; and
   combining a phase of the at least one second response signal with a phase of another second response signal to obtain the phase information of the magnetic field generated by the RF pulse and the intensity information of the main magnetic field.

8. A non-transitory computer readable recording medium having thereon a program that, when executed by a processor, performs the method of claim 1.

9. An apparatus for obtaining main magnetic field information and radio frequency (RF) pulse related information in a magnetic resonance imaging (MRI) system, the apparatus comprising:
   a response signal obtaining unit providing a pulse sequence comprising a pulse having a first flip angle and a pulse having a second flip angle, obtaining at least one first response signal with respect to the pulse having the first flip angle, from a target object, and at least one second response signal with respect to the pulse having the second flip angle, from the target object; and
   a processor generating information of the main magnetic field and information of the magnetic field generated by the RF pulse, based on the at least one first response signal and the at least one second response signal.

10. The apparatus of claim 9, wherein the first flip angle is different from the second flip angle.

11. The apparatus of claim 9, wherein each of predetermined time intervals comprises a repetition time (TR), which is a time interval at which the pulse having the first flip angle and the pulse having the second flip angle are applied, and the repetition time (TR) is variable.

12. The apparatus of claim 9, wherein the information of the main magnetic field comprises information about an intensity of the main magnetic field of the MRI system, and the information of the magnetic field generated by the RF pulse comprises at least one of intensity information and phase information of the magnetic field generated by an RF pulse that is applied to the target object.

13. The apparatus of claim 12 wherein the response signal obtaining unit further configured to:
   transmit the pulse having the first flip angle with respect to the target object;
   receive the at least one first response signal from the target object; and obtain an amplitude of the received at least one first response signal.

14. The apparatus of claim 13, wherein the response signal obtaining unit transmits the pulse having the second flip angle with respect to the target object, receives the at least one second response signal from the target object, obtains an amplitude of the received at least one second response signal; and obtains a phase of the received at least one second response signal.

15. The apparatus of claim 14, wherein the processor further configured to:
- combine the obtained amplitude of the at least one first response signal and the obtained amplitude of the at least one second response signal to obtain intensity information of the magnetic field generated by the RF pulse that is applied to the target object;
- combine a phase of the at least one second response signal with a phase of another second response signal to obtain the phase information of the magnetic field generated by the RF pulse; and
- obtain information about the intensity information of the main magnetic field.

\* \* \* \* \*